(12) United States Patent
Wu

(10) Patent No.: US 9,818,456 B1
(45) Date of Patent: Nov. 14, 2017

(54) STORAGE MODULE INSTALLED WITH MULTIPLE M.2 SSDS

(71) Applicant: IOI Technology Corporation, New Taipei (TW)

(72) Inventor: Hua-Kang Wu, New Taipei (TW)

(73) Assignee: IOI Technology Corporation, New Taipei (TW)

( * ) Notice: Subject to any disclaimer, the term of this patent is extended or adjusted under 35 U.S.C. 154(b) by 0 days.

(21) Appl. No.: 15/446,008

(22) Filed: Mar. 1, 2017

(30) Foreign Application Priority Data

Nov. 15, 2016 (TW) .............................. 105217421 A

(51) Int. Cl.
| H05K 7/00 | (2006.01) |
| G06F 1/20 | (2006.01) |
| G11C 5/04 | (2006.01) |
| H05K 5/00 | (2006.01) |
| H05K 7/14 | (2006.01) |
| H05K 5/02 | (2006.01) |
| G06F 1/18 | (2006.01) |
| G11C 5/14 | (2006.01) |

(52) U.S. Cl.
CPC ............... *G11C 5/04* (2013.01); *G06F 1/187* (2013.01); *G11C 5/14* (2013.01); *H05K 5/0021* (2013.01); *H05K 5/0065* (2013.01); *H05K 5/026* (2013.01); *H05K 5/0247* (2013.01); *H05K 7/1427* (2013.01)

(58) Field of Classification Search
CPC ...................................................... G06F 13/40
USPC .................................................... 361/679.01
See application file for complete search history.

(56) References Cited

U.S. PATENT DOCUMENTS

| 2007/0167064 A1* | 7/2007 | Shih ....................... G06F 1/186 439/372 |
| 2012/0033370 A1* | 2/2012 | Reinke ..................... G06F 1/185 361/679.4 |
| 2017/0023970 A1* | 1/2017 | Kimura .................. G06F 3/0679 |
| 2017/0215296 A1* | 7/2017 | Tsai ....................... H05K 7/1487 |

* cited by examiner

*Primary Examiner* — Jerry Wu
(74) *Attorney, Agent, or Firm* — CKC Partners Co., Ltd.

(57) ABSTRACT

A storage module installed with multiple M.2 SSDs includes a frame, at least one circuit assembly, and plural M.2 SSDs. The circuit assembly is fixed to the frame along a direction. The circuit assembly includes plural circuit modules and a power connector. The circuit modules are electrically connected to each other in series. Each of the circuit modules includes a circuit board, a M.2 slot, and a signal connector. The circuit board is fixed to the frame. The M.2 slot is fixed to the circuit board. The signal connector is electrically connected to the circuit board and located outside the frame. The power connector is electrically connected to the circuit board of a corresponding one of the circuit modules. The M.2 SSDs plug into the M.2 slots of the circuit modules respectively.

10 Claims, 5 Drawing Sheets

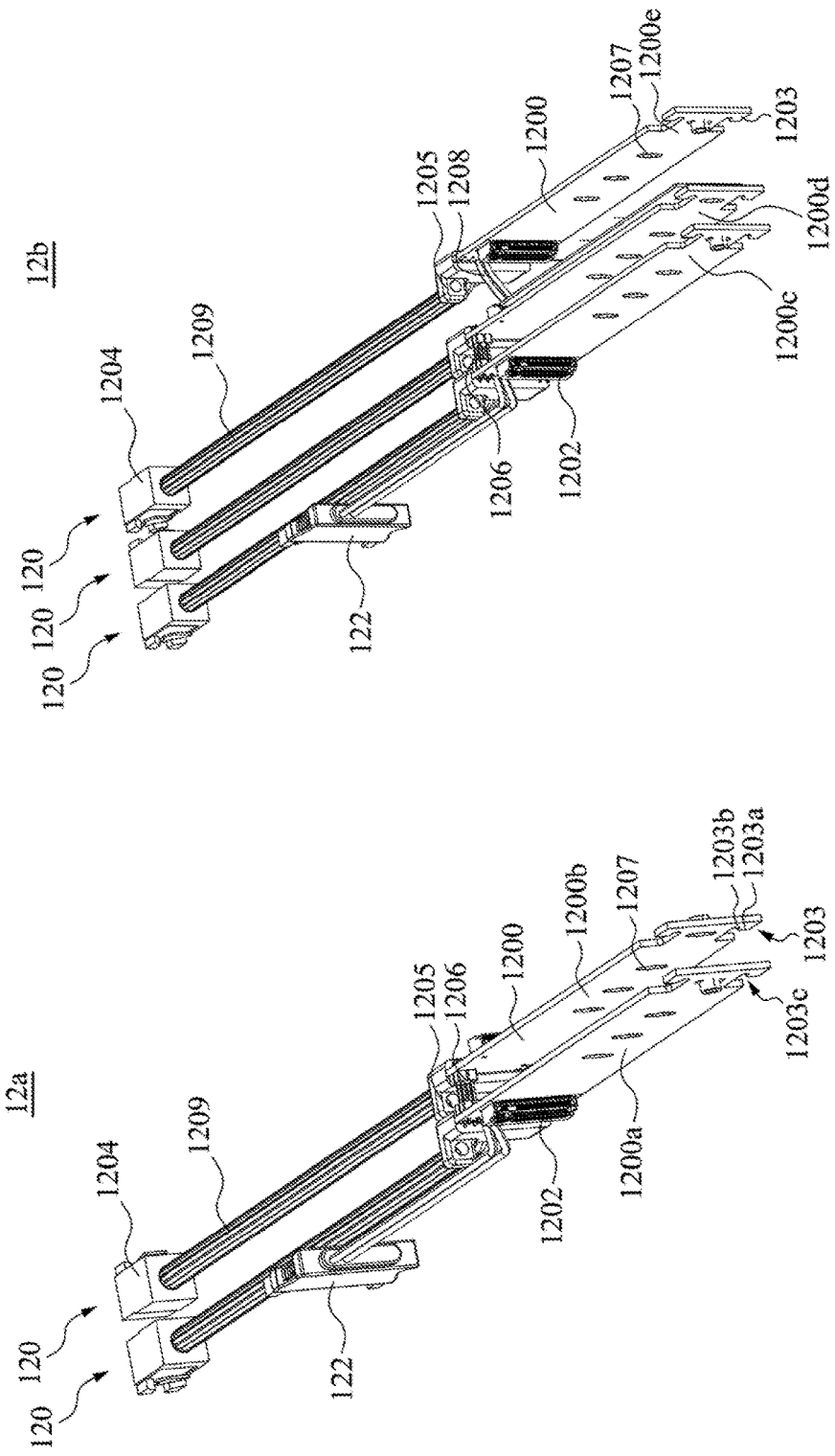

STORAGE MODULE INSTALLED WITH MULTIPLE M.2 SSDS

CROSS-REFERENCE TO RELATED APPLICATION

This application claims priority to Taiwan Application Serial Number 105217421, filed Nov. 15, 2016, which is herein incorporated by reference.

BACKGROUND

Field of Invention

The present invention relates to a storage module installed with multiple M.2 (Next Generation Form Factor, NGFF) Solid State Disks (SSDs).

Description of Related Art

A motherboard of a conventional personal computer has PCIe (Peripheral Component Interconnect Express) connector therein. The PCIe multilayer protocol specification is to enhance transmission speed of a bus disposed in the computer. As a result, the PCIe connector is suitable for a high-speed data access. In addition, conventional M.2 (Next Generation Form Factor, NGFF) Solid State Disks (SSDs) take advantage of PCIe NVMe (Non-Volatile Memory express) interface. The PCIe NVMe interface has high transmission speed, small size, and low power consuming, and has been widely used in, such as, notebook computers or tablet computers. In present, some high-end desktop computers have built-in M.2 SSD slots. Alternatively, a board converting M.2 to PCIe on the market also can be used in the computers as without built-in M.2 SSD slots disposed in the computer. However, the aforementioned structure is only for a server of a single application, but not for the new Internet of Things (IoT) or large data centers which require multiple storage applications. Therefore, how to extend the multiple applications of M.2 SSDs is a problem that the person skilled in the art has been faced with.

SUMMARY

The present disclosure provides a storage module installed with multiple M.2 (Next Generation Form Factor, NGFF) Solid State Disks (SSDs).

The present disclosure provides a storage module installed with multiple M.2 SSDs. A storage module installed with multiple M.2 SSDs includes a frame, at least one circuit assembly, and plural M.2 SSDs. The circuit assembly is fixed to the frame along a direction. The circuit assembly includes plural circuit modules and a power connector. The circuit modules are electrically connected to each other in series. Each of the circuit modules includes a circuit board, a M.2 slot, and a signal connector. The circuit board is fixed to the frame. The M.2 slot is fixed to the circuit board. The signal connector is electrically connected to the circuit board and located outside the frame. The power connector is electrically connected to the circuit board of a corresponding one of the circuit modules. The M.2 slots plug into the M.2 slots of the circuit modules respectively.

In the aforementioned configurations, the storage module installed with multiple M.2 SSDs of the present disclosure can convert a plurality of the M.2 SSDs from types of single boards to a type of a 3.5-inch hard disk (HD) or a 5.25-inch CD-ROM. Furthermore, because the storage module of the present disclosure includes at least one circuit assembly which can include at least two circuit modules, one power connector can supply power to a plurality of the circuit modules. In the aforementioned configuration, the structure of the storage module can be simplified, and can modularize type of the circuit assembly depending on actual requirements. Therefore, the aforementioned structure can reduce production costs of the storage module, and the number of the M.2 SSDs disposed in the frame can be expanded.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a perspective view of a circuit assembly according to some embodiments of the present disclosure in which the circuit assembly includes two circuit modules;

FIG. 3 is a perspective view of another circuit assembly according to some embodiments of the present disclosure in which the circuit assembly includes three circuit modules;

DETAILED DESCRIPTION

Figure 1:
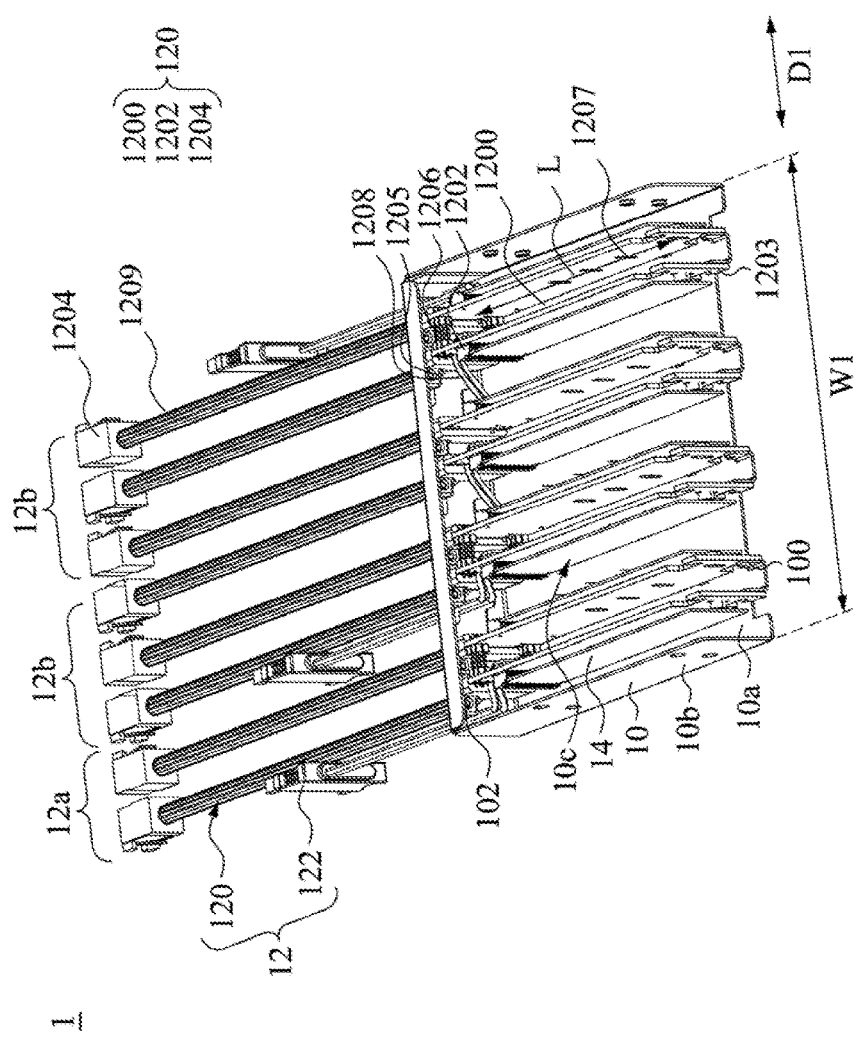
FIG. 1 is a perspective view of a storage module installed with multiple M.2 (Next Generation Form Factor, NGFF) Solid State Disks (SSDs) according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is made to FIG. 1. FIG. 1 is a perspective view of a storage module 1 installed with multiple M.2 (Next Generation Form Factor, NGFF) Solid State Disks (SSDs) according to some embodiments of the present disclosure. As shown in FIG. 1, in the embodiment, the storage module 1 includes a frame 10, three circuit assemblies 12 (i.e. one circuit assembly 12a and two circuit assemblies 12b) and plural M.2 SSDs (eight are depicted). The structure and function of the components and their relationships are described in detail hereinafter.

In FIG. 1, the frame 10 of the storage module 1 includes a bottom surface 10a and opposite two side walls 10b. The bottom 10a and the side walls 10b form an accommodation space 10c. The circuit assemblies 12 (i.e. one circuit assembly 12a and two circuit assemblies 12b) are at least partially located in the accommodation space 10c, and are respectively fixed to the frame 10 along a direction D1. Furthermore, the frame 10 has a width in a direction D1 along which the circuit assemblies 12 are arranged. The width of the frame 10 is substantially equal to 5.25-inch. The term "substantially" as used herein may be applied to modify any quantitative representation which could permissibly vary without resulting in a change in the basic function to which it is related. The frame 10 is configured to fix to a 5.25-inch CD-ROM standard slot in a personal computer case. In the embodiment, the circuit assembly 12 includes plural circuit modules 120 and a power connector 122. The power connector 122 is electrically connected to the circuit board 1200 of a corresponding one of the circuit modules 120. The circuit modules 120 of the circuit assembly 12 electrically connected to each other in series. For example, reference is made to FIGS. 2 and 3. FIGS. 2 and 3 respectively are perspective views of a circuit assembly 12a and a circuit assembly 12b according to some embodiments of the present disclosure, in which the circuit assembly 12a includes two circuit modules and the circuit assembly 12b includes three circuit modules.

As shown in FIG. 2, in the embodiment, each of the circuit modules 120 includes a circuit board 1200, a M.2 slot 1202, and a signal connector 1204. The circuit board 1200 is fixed to the frame 10 (shown in FIG. 1). The M.2 slot 1202 is fixed to the circuit board 1200 and supports a hard disk (HD) of a PCIe (Peripheral Component Interconnect Express) standard or a SATA (Serial Advanced Technology Attachment) standard. The signal connector is electrically connected to the circuit board 120 and located outside the frame 10. The M.2 SSDs 14 plug into the M.2 slots 1202 of the circuit modules 120 respectively (shown in FIG. 1).

In the embodiment, the signal connector 1204 is electrically connected to the circuit board 1200, is located outside the frame 10 (shown in FIG. 1), and is a SFF (Small Form Factor)-8643. In some embodiments, the signal connector 1204 may be a SFF-8639 or an OcuLink (Optical Copper (Cu) Link), but the present disclosure is not limited thereto. Each of the circuit modules 120 further includes a signal connecting cable 1209. The signal connecting cable 1209 is electrically connected between the signal connector 1204 and the circuit board 1200, and is a PCIe cable, but the present disclosure is not limited thereto. In some embodiments, the signal connector 1204 may be a SATA connector, and the signal connecting cable 1209 may be a SATA cable.

Furthermore, the power connector 122 of the circuit assembly 12a is electrically connected to the circuit board 1200 of a corresponding one of the circuit modules 120. In the embodiment, the power connector 122 is electrically connected to the circuit board 1200a. Alternatively, in some embodiments, the power connector 122 may be electrically connected to the circuit board 1200b.

In FIG. 2, the circuit assembly 12a includes two circuit modules 120. Each of the circuit modules 120 includes a power pin assembly 1206. The power pin assembly 1206 is fixed to the circuit board 1200 in said each of the circuit modules 120. The power pin assembly 1206 of one of the circuit modules 120 is electrically connected to the circuit board 1200 of another one of the circuit modules 120. In other words, the power pin assembly 1206 fixed to the circuit board 1200a is electrically connected to the circuit board 1200b. Relatively, in the embodiment, the power pin assembly (not shown) fixed to the circuit board 1200b is electrically connected to the circuit board 1200a.

In FIG. 3, the circuit assembly 12a includes three circuit modules 120 and a power connecting cable 1208. The power pin assembly 1206 of one of adjacent two of the circuit modules 120 is electrically connected to the circuit board 1200 of another one of said adjacent two of the circuit modules 120. In the embodiment of the three circuit modules 120, a distance between the circuit board 1200c and the circuit board 1200d is smaller than a distance between the circuit board 1200d and the circuit board 1200e. In other words, the power pin assembly 1206 fixed to the circuit board 1200c is electrically connected to the circuit board 1200d. Relatively, in the embodiment, the power pin assembly (not shown) fixed to the circuit board 1200d is electrically connected to the circuit board 1200e. Furthermore, the circuit board 1200e of the circuit modules 120 is electrically connected to the circuit board 1200d through the power connecting cable 1208. In the embodiment, the power connecting cable 1208 is fixed between the circuit board 1200d and the circuit board 1200e.

Alternatively, in some embodiments, the power connecting cable 1208 may be fixed from the circuit board 1200c to the circuit board 1200e. In some embodiment, the power connecting cable 1208 or the power pin assembly 1206 1206 can be selectively configured according to the actual demand. Furthermore, in FIG. 3, the power connector 122 of the circuit assembly 12b is electrically connected to the circuit board 1200 of a corresponding one of the circuit modules 120. In the embodiment, the power connector 122 is electrically connected to the circuit board 1200c. In practical applications, he power connector 122 can be configured flexible according to the actual demand.

As such, because the storage module 1 may be able to include at least one circuit assembly 12 which can include at least two circuit modules 120, one power connector 122 can supply power to a plurality of the circuit modules 120. In the aforementioned configuration, the structure of the storage module 1 can be simplified, and can modularize type of the circuit assembly 12 depending on actual requirements. Therefore, the aforementioned structure can reduce production costs of the storage module 1. Furthermore, the storage module 1 can be cooperated into a conventional 5.25-inch CD-ROM standard slot in a personal computer case, and the number of the M.2 SSDs 14 disposed in the frame 10 can be more expanded.

Reference is made to FIG. 1. In the embodiment, the frame 10 has plural first engaging portions 100 and plural first fastening portions 102 on opposite two ends thereof. Each of the circuit boards 1200 has a second engaging portion 1203 and a second fastening portion 1205 on opposite two ends thereof (shown in FIG. 2). In said configuration, the second fastening 1205 portion of the circuit board 1200 is fastened to a corresponding one of the first fastening portions 102 of the frame 10, and the second engaging portion 1203 of the circuit board 1200 is engaged to a corresponding one of the first engaging portions 100 of the frame 10. However, the present disclosure is not limited to the foregoing combinations between the circuit board 1200 and the frame 10, all suitable methods that may combine the circuit board 1200 and the frame 10 can be applied to the present disclosure.

More specifically, the second engaging portion 1203 of the circuit board 1200 includes a necking section 1203a and a protruding section 1203b. The circuit board 1200, the necking section 1203a, and the protruding section 1203b commonly define an engaging notch 1203c (shown in FIG. 2). In the embodiment, the first engaging portion 100 of the frame 10 is the first protruding portion. A profile of the first protruding portion is match with a profile of the engaging notch 1203c.

A method for assembling the circuit board 1200 to the frame 10 includes firstly engaging the second engaging portion 1203 of the circuit board 1200 to the first engaging portion 100 of the frame 10. Then, fastening the second fastening portion 1205 of the circuit board 1200 to the first fastening portions 102 of the frame 10, and then the assembly of the circuit board 1200 to the frame 10 is completed, thereby enabling the circuit board 1200 to fix to the frame 10 stably, and the combination method between the circuit board 1200 and the frame 10 can be simplified.

Furthermore, because the combination method between an end of the circuit board 1200 and an end of the frame 10 is carried out in a manner with engaging and the second engaging portion 1203 of the circuit board 1200 includes the necking section 1203a and the protruding section 1203b, when the storage module 1 is suffered form an external force, the second engaging portion 1203 of the circuit board 1200 is limit by the necking section 1203a and the protruding section 1203b, thereby preventing the circuit board 1200 from shaking or displacing by the external force exerted to the storage module 1. Furthermore, because the protruding section 1203b of the second engaging portion 1203 is located outside the engaging notch 1203c, when the storage module 1 is suffered from the external force, the second engaging portion 1203 of the circuit board 1200 is limit in the engaging notch 1203c of the first fastening portion 102, but is without detaching from the first fastening portion 102 of the frame 10. Moreover, because the second engaging portions 1203 is formed on an end of the circuit board 1200 symmetrically, the circuit board 1200 can fix to the frame 10 through another one of the second engaging portions 1203 by inverting the circuit assembly 12.

As shown in FIG. 1, in the embodiment, the circuit board 1200 has plural fixing hole 1207. The fixing hole 1207 of the circuit board 1200 is apart from the M.2 slot 1202 by a distance L. The distance L is substantially equal to 42 mm, 60 mm, 80 mm, or 110 mm. The fixing hole 1207 is configured to fix the M.2 SSD, thereby enabling different sizes of the M.2 SSDs 14 to insert into the M.2 slots 1202 and to fix to the circuit boards 1200 through the fixing holes 1207s respectively to enhance the strength of the storage module 1 on the structure.

In the embodiment, the circuit boards 1200 are perpendicular to the bottom surface 10a of the frame 10, and are parallel to each other, thereby enabling the space of the frame 10 to be utilized sufficiently, and thus the number of the M.2 SSDs 14 disposed in the frame 10 can be more expanded.

Figure 5:
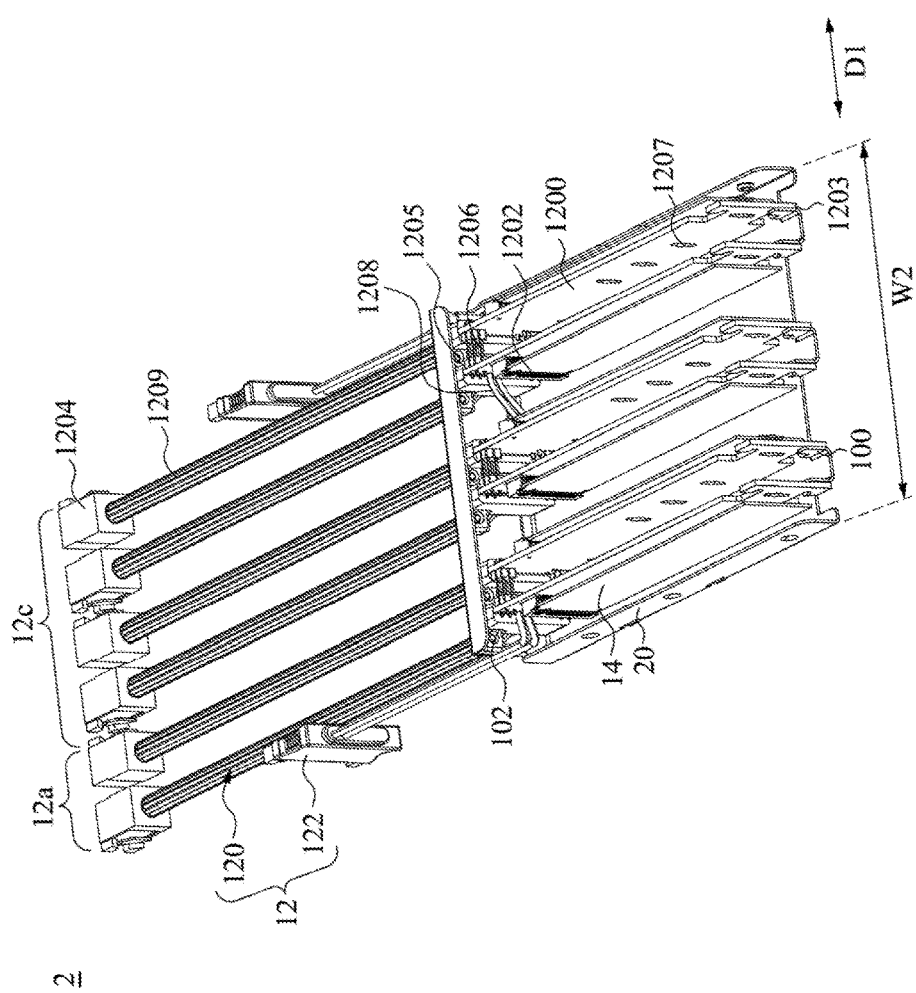
FIG. 5 is a perspective view of another storage module installed with multiple M.2 SSDs according to some embodiments of the present disclosure.

Reference is made to FIG. 5. FIG. 5 is a perspective view of another storage module 2 installed with multiple M.2 SSDs according to some embodiments of the present disclosure. As shown in FIG. 5, in the embodiment, the storage module 2 includes a frame 20, two circuit assemblies 12 (i.e. one circuit assembly 12a and one circuit assembly 12c) and plural M.2 SSDs 14 (six are depicted). The structure and function of the elements and the relationship therebetween in FIG. 5 are substantially the same as that 1 in FIG. 1, and the related detailed descriptions may refer to the foregoing paragraphs, and are not discussed again herein.

Figure 4:
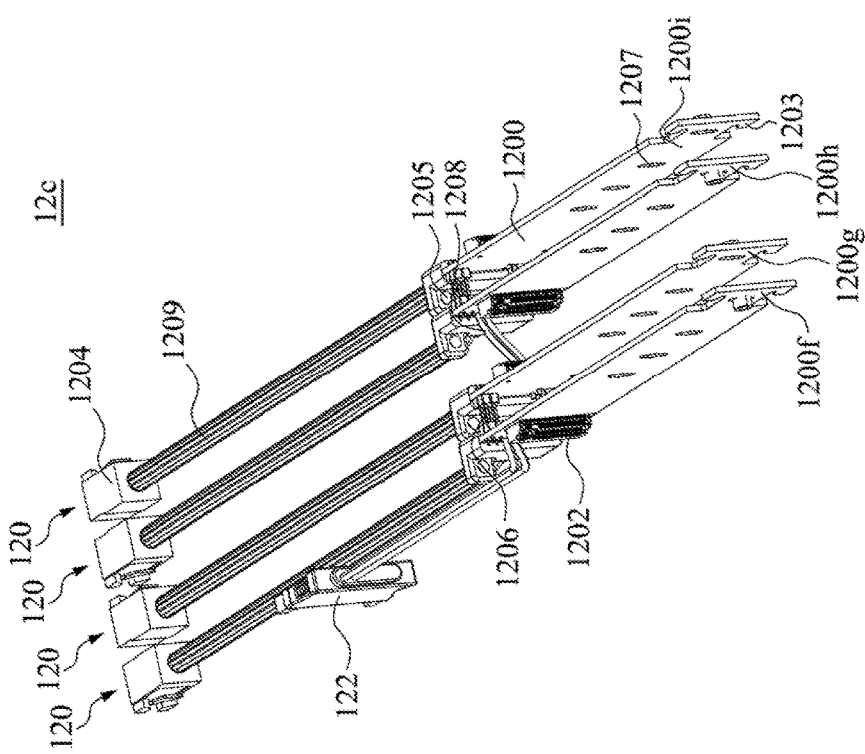
FIG. 4 is a perspective view of another circuit assembly according to some embodiments of the present disclosure in which the circuit assembly includes four circuit modules.

It is noted that, the difference between the present embodiment and that in FIG. 1 are in that the frame 20 of the embodiment has a width W2 in a direction along which the circuit assemblies 12 are arranged. The width W2 of the frame 20 is substantially equal to 3.5-inch. The frame 20 is configured to fix to a 3.5-inch hard disk (HD) standard slot in a personal computer case. Furthermore, in the embodiment, the two circuit assemblies 12 include a circuit assembly 12c, and the storage module 2 includes six M.2 SSDs 14. For example, reference is made to FIG. 4. FIG. 4 is a perspective view of another circuit assembly 12c according to some embodiments of the present disclosure in which the circuit assembly 12c includes four circuit modules 120.

As shown in FIG. 4, in the embodiment, the circuit assembly 12c includes two pairs of the circuit modules 120 arranged along the direction D1 and the power connecting cable 1208. Each of the circuit modules 120 includes a power pin assembly 1206. The power pin assembly 1206 is fixed to the circuit board 1200 in said each of the circuit modules 120.

Specifically, the power pin assembly 1206 fixed to the circuit board 1200f is electrically connected to the circuit board 1200g, and the power pin assembly 1206 fixed to the circuit board 1200h is electrically connected to the circuit board 1200i in each pair of the circuit modules 120. Relatively, the power pin assembly (not shown) fixed to the circuit board 1200g is electrically connected to the circuit board 1200f, and the power pin assembly (not shown) fixed to the circuit board 1200i is electrically connected to the circuit board 1200h in each pair of the circuit modules 120. Furthermore, the circuit board 1200g and the circuit board 1200h arranged in a center of said two pairs of the circuit modules 120 are electrically connected to each other through the power connecting cable 1208. In the embodiment, the power connecting cable 1208 is fixed between the circuit board 1200g and the circuit board 1200h.

In FIG. 4, the power connector 122 of the circuit assembly 12c is electrically connected to the circuit board 1200 of a corresponding one of the circuit modules 120. In the embodiment, the power connector 122 is electrically connected to the circuit board 1200f. In practical applications, the power connector 122 can be configured flexible according to the actual demand, and thereby enabling one power connector 122 to supply power to a plurality of the circuit modules 120, thereby simplifying configuration of the storage module 2, and the modularizing type of the circuit assembly 12 can depend on actual requirements. Therefore, the aforementioned structure can reduce production costs of the storage module 2. Furthermore, the storage module 2 can be cooperated into a conventional 3.5-inch hard disk (HD) standard slot in a personal computer case, and the number of the M.2 SSDs 14 disposed in the frame 20 can be more expanded.

Figure 6:
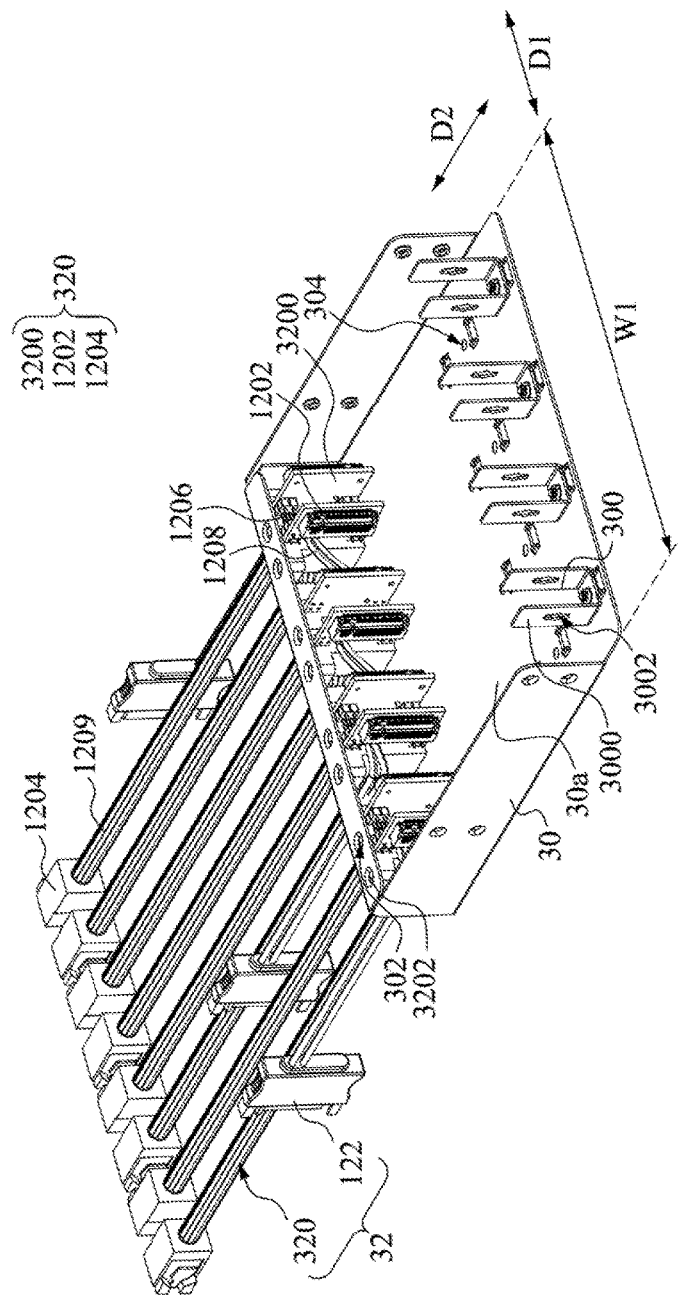
FIG. 6 is a perspective view of another storage module installed with multiple M.2 SSDs according to some embodiments of the present disclosure.

Reference is made to FIG. 6. FIG. 6 is a perspective view of another storage module 3 installed with multiple M.2 SSDs according to some embodiments of the present disclosure. As shown in FIG. 6, in the embodiment, the storage module 3 includes a frame 30 and three circuit assemblies 32, Furthermore, M.2 SSDs are omitted to illustrate in FIG. 6 for more detailed describing the embodiment. The structure and function of the elements and the relationship therebetween in FIG. 6 are substantially the same as that 1 in FIG. 1, and the related detailed descriptions may refer to the foregoing paragraphs, and are not discussed again herein.

It is noted that, the difference between the present embodiment and that in FIG. 1 are in that the frame 30 has plural first through hole 302 and plural fastening bracket 300 (four are depicted) on opposite two ends thereof. Each of the fastening bracket 300 includes at least one fastening arm 3000 (two are depicted), and the fastening arm 3000 has a second through hole 3002. The fastening bracket 30 is fastened to the frame 30 through a third through hole 304 on a bottom surface 30a of the frame 30. Furthermore, in the circuit assembly 32, an end of the circuit board 3200 of the circuit module 120 has a second protruding portion 3202. Therefore, the frame 10 and the circuit board 1200 shown in FIG. 1 are respectively replaced with the frame 30 and the circuit board 3200 in this embodiment.

In FIG. 6, the second protruding portion 3202 of the circuit board 3200 is joined to the first through hole 302 of the frame 30. An end of the M.2 SSDs 14 (not shown) inserts into the of the M.2 slot 1202 of the circuit module 320, and another end of the M.2 SSDs 14 is fixed to the frame 30 through the second through hole 3002 of the fastening bracket 300. Furthermore, a bottom surface 30a of the frame 30 has plural third through holes 304 arranged along the direction D2. The second through holes 3002 of the fastening bracket 300 has different distances to the M.2 slot 1202 by fixing the fastening bracket 300 to different third through holes 304. As such, the M.2 SSDs (not shown) having different standards can fix to the storage module 3 by the third through hole 304 of a corresponding one of the fastening bracket 300 and one of the M.2 slots 1202.

A method for assembling the circuit board 3200 to the frame 30 includes firstly joining the second proturding portion 3202 of the circuit board 3200 to the first through hole 302 of the frame 30. Then, inserting an end of the M.2 SSDs (not shown) into the M.2 slots 1202 of the circuit module 320. Then, fixing another end of the M.2 SSDs to the frame 30 through the second through hole 3002 of the fastening bracket 300, and then the assembly of the circuit board 3200 to the frame 30 is completed, thereby enabling the circuit board 3200 to fix to the frame 30 stably, and the combination method between the circuit board 3200 and the frame 30 can be simplified.

According to the foregoing recitations of the embodiments of the disclosure, it can be seen that the storage module installed with multiple M.2 SSDs of the present disclosure can convert a plurality of the M.2 SSDs from types of single boards to a type of a 3.5-inch hard disk (HD) or a 5.25-inch CD-ROM. Furthermore, because the storage module of the present disclosure includes at least one circuit assembly which can include at least two circuit modules, one power connector can supply power to a plurality of the circuit modules. In the aforementioned configuration, the structure of the storage module can be simplified, and can modularize type of the circuit assembly depending on actual requirements. Therefore, the aforementioned structure can reduce production costs of the storage module, and the number of the M.2 SSDs disposed in the frame can be more expanded.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A storage module installed with multiple M.2 SSDs, comprising: a frame comprising a plurality of engaging portions and fastening portions on opposite two ends thereof;

at least one circuit assembly fixed to the frame along a direction, and the circuit assembly comprising: a plurality of circuit modules electrically connected to each other in series, and each of the circuit modules comprising: a circuit board fixed to the corresponding engaging portions and fastening portion of the frame; a M.2 slot fixed to the circuit board, and a signal connector electrically connected to the circuit board by a cable and located outside the frame; and a power connector comprising a cable electrically connected to the circuit board of a corresponding one of the circuit modules and located outside the frame; and a plurality of M.2 SSDs plugged into the M.2 slots of the circuit modules respectively; and the circuit boards of the circuit modules are perpendicular to a bottom surface of the frame, and are parallel to each other.

2. The storage module installed with multiple M.2 SSDs of claim 1, wherein a quantity of the circuit modules is two, each of the circuit modules comprises a power pin assembly, the power pin assembly is fixed to the circuit board in said each of the circuit modules, and the power pin assembly of one of the circuit modules is electrically connected to the circuit board of another one of the circuit modules.

3. The storage module installed with multiple M.2 SSDs of claim 1, further comprising a power connecting cable, and wherein a quantity of the circuit modules is three, each of the circuit modules comprises a power pin assembly, the power pin assembly is fixed to the circuit board in said each of the circuit modules, the power pin assembly of one of adjacent two of the circuit modules is electrically connected to the circuit board of another one of said adjacent two of the circuit modules, and the circuit board of a remaining one of the circuit modules is electrically connected to the circuit board of a corresponding one of said adjacent two through the power connecting cable.

4. The storage module installed with multiple M.2 SSDs of claim 1, further comprising a power connecting cable, and wherein a quantity of the circuit modules is two pairs and the circuit modules are arranged along the direction, each of the circuit modules comprises a power pin assembly, the power pin assembly is fixed to the circuit board in said each of the circuit modules, the power pin assembly of one of the circuit modules is electrically connected to the circuit board of another one of the circuit modules in each pair of the circuit modules, and the circuit boards arranged in a center of said two pairs of the circuit modules are electrically connected to each other through the power connecting cable.

5. The storage module installed with multiple M.2 SSDs of claim 1, wherein the frame has a plurality of first engaging portions and a plurality of first fastening portions on opposite two ends thereof, each of the circuit boards has a second engaging portion and a second fastening portion on opposite two ends thereof, the second fastening portion is fastened to a corresponding one of the first fastening portions, and the second engaging portion is engaged to a corresponding one of the first engaging portions.

6. The storage module installed with multiple M.2 SSDs of claim 1, wherein the circuit board has at least one fixing hole, the fixing hole is apart from a corresponding one of the M.2 slots of the circuit modules by a distance and is configured to fix a corresponding one of the M.2 SSDs, wherein the distance is substantially equal to 42 mm, 60 mm, 80 mm, or 110 mm.

7. The storage module installed with multiple M.2 SSDs of claim 1, wherein the frame has a width in a direction along which the circuit assemblies are arranged, the width is substantially equal to 5.25-inch or 3.5-inch, and the frame is configured to fix to a 5.25-inch CD-ROM standard slot or a 3.5-inch HD standard slot in a personal computer case.

8. The storage module installed with multiple M.2 SSDs of claim 1, wherein the M.2 slot of each of the circuit modules supports a HD of a PCIe standard or a SATA standard.

9. The storage module installed with multiple M.2 SSDs of claim 1, wherein each of the circuit modules comprising a first signal connecting cable, the first signal connecting cable is electrically connected between the signal connector and the circuit board in said each of the circuit modules, the signal connector is a SFF-8643, a SFF-8639, or an OcuLink, and the first signal connecting cable is a PCIe cable.

10. The storage module installed with multiple M.2 SSDs of claim 1, wherein each of the circuit modules comprising a second signal connecting cable, the second signal connecting cable is electrically connected between the signal connector and the circuit board in said each of the circuit modules, the signal connector is a SATA connector, and the first signal connecting cable is a SATA cable.

* * * * *